United States Patent
Du et al.

(10) Patent No.: US 8,681,485 B2
(45) Date of Patent: Mar. 25, 2014

(54) ENCLOSURE OF ANODIZED MULTI-LAYER METALLIC SHELL WITH MOLDED PLASTIC SCAFFOLDING AND METHOD OF MANUFACTURE

(75) Inventors: Shouzhong (Alex) Du, Singapore (SG); Richard Dale Michonski, Marengo, IL (US); Jichen (Jeff) Qin, Guang Zhou (CN); Wu Bing (Levin) Li, Guandong (CN); Suriaprakash Narotamo, Lisbon (PT)

(73) Assignee: Flextronics AP, LLC, Broomfield, CO (US)

( * ) Notice: Subject to any disclaimer, the term of this patent is extended or adjusted under 35 U.S.C. 154(b) by 118 days.

(21) Appl. No.: 12/928,941

(22) Filed: Dec. 22, 2010

(65) Prior Publication Data

US 2011/0186455 A1 Aug. 4, 2011

Related U.S. Application Data

(60) Provisional application No. 61/289,266, filed on Dec. 22, 2009.

(51) Int. Cl.
*G06F 1/16* (2006.01)
*H04M 1/00* (2006.01)
(52) U.S. Cl.
USPC ............ 361/679.02; 361/679.27; 361/679.55; 455/575.1
(58) Field of Classification Search
USPC .......... 174/50, 66, 520; 206/320; 361/679.01, 361/679.02, 679.08, 679.09, 679.21, 361/679.26, 679.27, 679.3, 679.55, 679.56; 428/457, 573, 574; 455/575.1, 575.3, 455/575.4, 575.8
See application file for complete search history.

(56) References Cited

U.S. PATENT DOCUMENTS

| | | | |
|---|---|---|---|
| 3,122,598 A | 2/1964 | Berger | |
| 6,574,096 B1 * | 6/2003 | Difonzo et al. | 361/679.27 |
| 6,620,371 B1 | 9/2003 | Winget et al. | |
| 6,768,654 B2 * | 7/2004 | Arnold et al. | 361/818 |
| 6,996,425 B2 | 2/2006 | Watanabe | |
| 7,947,900 B2 * | 5/2011 | Cheng et al. | 174/50 |
| 8,367,210 B2 | 2/2013 | Naritomi et al. | |
| 2005/0149860 A1 | 7/2005 | Murata | |
| 2006/0257624 A1 | 11/2006 | Naritomi et al. | |

(Continued)

FOREIGN PATENT DOCUMENTS

| | | |
|---|---|---|
| JP | 2004-268936 | 9/2004 |
| WO | 2004-41532 A1 | 5/2004 |
| WO | 2005-109984 A2 | 11/2005 |

OTHER PUBLICATIONS

*Nano Molding Technology on Cosmetic Aluminum Parts in Mobile Phones*; Annerfors et al.; Undated paper; School of Mechanical Engineering, Lund University, Sweden.

(Continued)

*Primary Examiner* — Luan K Bui
(74) *Attorney, Agent, or Firm* — Haverstock & Owens LLP (57) ABSTRACT

A device enclosure includes a clad metal shell having a plurality of mounting structures attached thereto. Methods for manufacturing the device enclosure are also disclosed. In a particular method, the mounting structures are formed on a surface of the clad metal shell by nano molding technology. Alternatively, the mounting structures are formed by molding before being attached to the clad metal shell by an adhesive.

9 Claims, 11 Drawing Sheets

(56) References Cited

U.S. PATENT DOCUMENTS

| | | | |
|---|---|---|---|
| 2007/0256850 A1 | 11/2007 | Hansen | |
| 2008/0224358 A1* | 9/2008 | Rogers et al. | 264/406 |
| 2009/0190290 A1* | 7/2009 | Lynch et al. | 361/679.01 |
| 2009/0257175 A1* | 10/2009 | Shi et al. | 361/679.01 |
| 2009/0260871 A1* | 10/2009 | Weber | 428/133 |
| 2009/0275370 A1 | 11/2009 | Schlub et al. | |

OTHER PUBLICATIONS

*Investigation of Optimum Process Parameters on the Sheet Hydroforming of Titanium / Aluminum Clad Metal for Battery Housing*; Tseng et al.; $4^{th}$ International Conference on Tube Hydroforming (Tubehydro 2009), Kaohsiung, Taiwan; Sep. 6-9, 2009.

PCT Application No. PCT/US2010/003233, International Search Report and Written Opinion dated Mar. 4, 2011.

Jeng, M.-C. et al., Rapid Mold temperature Control In Injection Molding By Using Steam Heating, International Communications in Heat and MAss transfer, vol. 37(2010), pp. 1295-1304.

Wang, G. et al., Research of Thermal Response Simulation and Mold Structure Optimization for Rapid Heat Cycle Molding Processes, Respectively, With Steam Heating and Electric Heating, Materials and Design, vol. 31 (2010), pp. 382-395.

* cited by examiner

ENCLOSURE OF ANODIZED MULTI-LAYER METALLIC SHELL WITH MOLDED PLASTIC SCAFFOLDING AND METHOD OF MANUFACTURE

RELATED APPLICATIONS

This application claims the benefit of priority to co-pending U.S. Provisional Patent Application Serial No. 61/289,266, filed Dec. 22, 2009 by the same inventors and entitled "Enclosure Of Anodized Bimetallic Shell With Molded Plastic Scaffolding And Method Of Manufacturing," which is incorporated by reference herein in its entirety.

BACKGROUND OF THE INVENTION

1. Field of the Invention

This invention relates generally to device enclosures, and more particularly to manufacturing metallic enclosures for electronic devices. Even more particularly, this invention relates to multi-layered metallic shells and methods of manufacturing such shells.

2. Description of the Background Art

Currently, the demand for electronic devices (e.g., computers, cellular phones, PDA's, etc.) is becoming increasingly more dependent on aesthetics. That is, consumers continuously seek the most up-to-date devices with the latest cosmetically appealing features and differentiating characteristics. As a result, more and more emphasis is being put into the enclosure design of such products. For example, metal enclosures (e.g., housings, battery covers, bezels, etc.) are the current trend in the 3C (computers, communications, and consumer electronics) industry. Devices housed within metal enclosures generally have a more attractive and overall higher quality appearance than that of conventional plastic enclosures.

Conventional metal enclosures typically include a shell and a plurality of mounting features. The shell is often formed from a piece of stamped sheet metal that is most commonly composed of aluminum or some alloy thereof The aluminum sheet metal includes an exterior surface and an interior surface. The exterior surface is typically decorated by one or more surface finishing techniques such as, for example, anodizing, electro-coating, pad/screen printing, dye sublimation, laser marking, etc. The mounting features (e.g., screw bosses, snap-features, etc.) are typically affixed to the interior surface of the shell so as to facilitate the mounting of the enclosure to the host device. In many enclosure designs, the mounting features are formed by some suitable process (e.g. molding) and then attached to the interior surface by some suitable means such as, for example, an adhesive or the like. In other designs, mounting features are formed directly on the interior surface by polymer-to-metal hybrid (PMH) technology which, in general, refers to the various known techniques of bonding polymers to metals. Forming mounting features on aluminum shells by PMH technology typically involves forming tiny pores on the interior surface of the shell and then molding plastic features directly thereon. In forming the pores, the interior surface is typically exposed to some suitable etching agent, for example an acid. The features are molded from a highly viscous plastic that, when in the liquid state, flows into the pores formed on the interior surface. Upon solidification, the plastic hardens to form a mounting feature that is mechanically bonded directly to the porous interior surface of the shell.

Although aluminum and/or aluminum alloy enclosures improve the appearance of products, there are disadvantages. For example, aluminum has a relatively low resistance to plastic deformation and is, therefore, prone to scratch and dent very easily. Of course, scratches and/or deformations on the enclosure substantially degrade the overall cosmetic appeal of the hosting device. Accordingly, the shell is often relatively thick in effort to reduce possible denting and warping of such enclosures.

In effort to alleviate the problems associated with aluminum and aluminum alloy enclosures, some designs incorporate shells formed from different types of metals that are more resistant to plastic deformation. For example, many enclosures are composed of magnesium that formed by some suitable metallurgical process such as, for example, casting. Typically, the shell and mounting features of magnesium enclosures are formed in the same process and from the same material (i.e. magnesium) such that both are one integral part. The magnesium enclosure is typically decorated using some suitable process such as, for example, micro-arc oxidation (MAO), heat transfer, water transfer, painting, etc.

Although magnesium enclosures are less susceptible to plastic deformation than aluminum enclosures, there are still several disadvantages. For example, magnesium enclosures are difficult to produce because of the poor manufacturability of magnesium. As another example, magnesium decorating processes are relatively difficult and, therefore, have a low success rate. As a result, successful throughput is very difficult and, therefore, expensive to achieve in manufacturing magnesium enclosures.

What is needed, therefore, is a design for a metal enclosure that is more resistant to damage. What is also needed is a design for a metal enclosure that can be manufactured with a higher success rate. What is also needed is a design for a metal enclosure that can be decorated with a higher success rate.

SUMMARY

The present invention overcomes the problems associated with the prior art by providing a design and method for manufacturing device enclosures having clad metal shells with mounting features attached thereto. The invention facilitates manufacturing metal device enclosures that are aesthetically pleasing and have a higher resistance to damage.

An electronic device enclosure includes a clad metal shell and plastic mounting structures attached thereto. The clad metal shell includes a first layer formed from a first type of metal and a second layer formed from a second type of metal that is different from the first type of metal. The first layer defines a first surface upon which the mounting structures are attached.

In a particular embodiment, the mounting structures are formed directly on the first surface of the first layer by nano molding technology. In another embodiment, the mounting structures are formed by molding and then later attached to the first surface of the shell by an adhesive. In yet another embodiment, the mounting structure is attached by metal adhesive molding.

In an example embodiment, the metal shell is stamped from clad sheet metal. The decorative feature is formed on the shell by laser marking. Optionally, at least a portion of the shell is anodized. The metal shell is constructed from bimetallic clad metal wherein, for example, the first type of metal includes aluminum and the second type of metal includes titanium. As another example, the first type of metal can include aluminum and the second type of metal can include stainless steel. As yet another example, the bimetallic metal can be cold-rolled bimetallic clad sheet metal. Optionally, the metal shell can include three or more metal layers.

Methods for manufacturing an electronic device enclosure are also disclosed. One example method includes providing clad sheet metal having a first metal layer composed of a first type of metal and a second metal layer composed of a second type of metal, providing a moldable material, forming the clad sheet metal into an enclosure shell having an interior surface defined on the first metal layer of the clad sheet metal, and forming the moldable material into a mounting structure that is attached to the interior surface of the shell.

In a particular method, the step of forming the mounting structures includes forming the mounting structures directly on the first surface of the first layer by nano molding technology. In another embodiment, the step of forming the mounting structure includes forming the mounting structure by molding and then later attaching it to the first surface of the shell by an adhesive. In yet another embodiment, the step of attaching the mounting structure to the interior surface of the shell is achieved by metal adhesive molding.

In a more particular method, the step of forming the clad sheet metal into the metal shell includes stamping the metal shell out of clad sheet metal. A more particular method further includes forming a decorative feature on the shell by laser marking. Another more particular method further includes anodizing at least a portion of the shell. In another more particular method, the step of providing clad sheet metal includes providing bimetallic clad sheet metal. In an even more particular method, the first type of metal includes aluminum and the second type of metal includes titanium. In another example method, the first type of metal includes aluminum and the second type of metal includes stainless steel. In another particular method, the bimetallic metal is cold-rolled bimetallic clad sheet metal. In yet another more particular method, the metal shell includes a third metal layer, or even additional metal layers.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a device enclosure having a clad metal shell and a plurality of mounting structures attached thereto. In the following description, numerous specific details are set forth (e.g., host device details) in order to provide a thorough understanding of the invention. Those skilled in the art will recognize, however, that the invention may be practiced apart from these specific details. In other instances, details of well known manufacturing practices (e.g., plastic injection molding, mold tooling, etc.) and components have been omitted, so as not to unnecessarily obscure the present invention.

Figure 1:
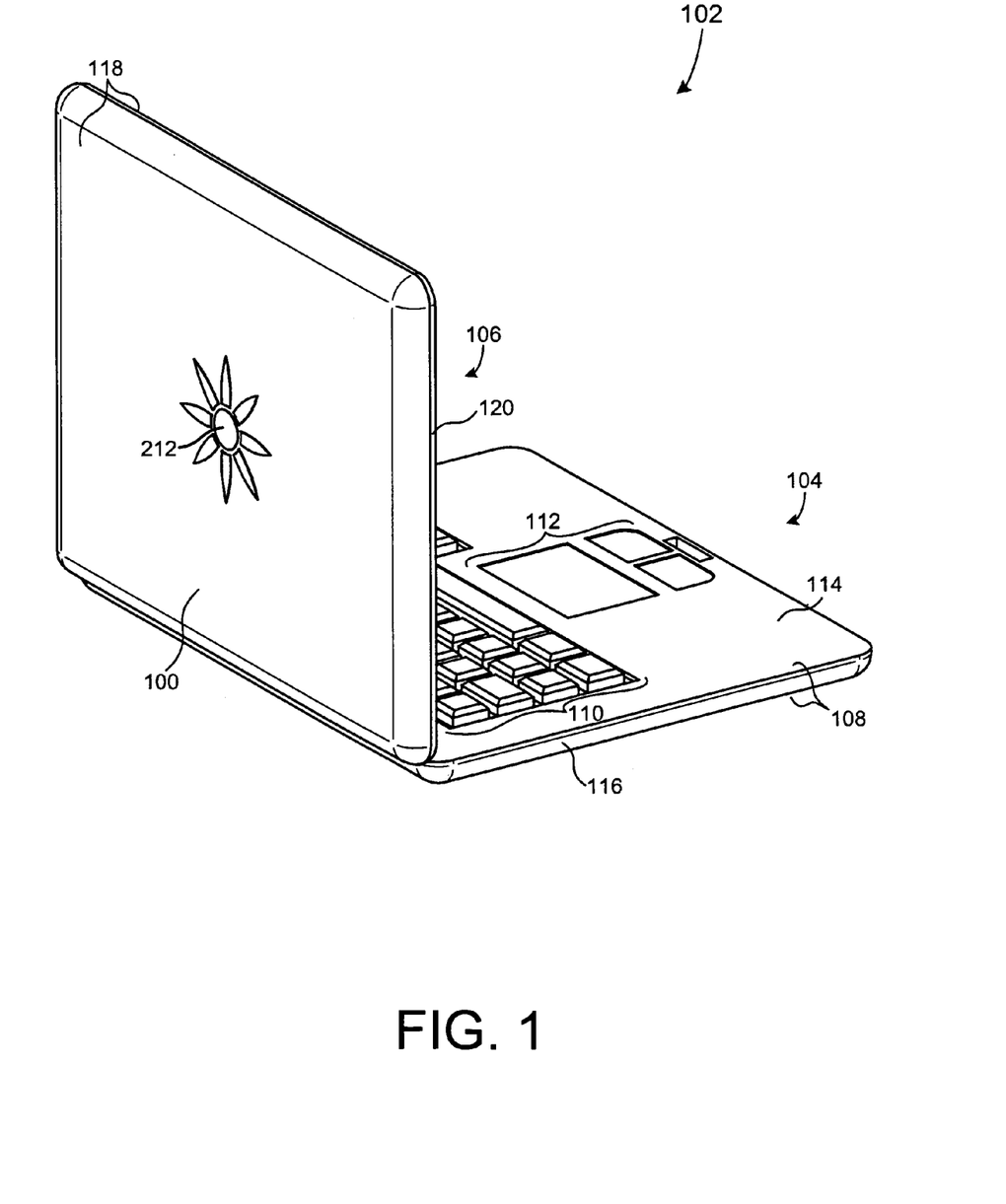
FIG. 1 is a perspective view of an example enclosure mounted on a laptop computer.

FIG. 1 shows a perspective view of an enclosure 100 which, in this particular embodiment, is depicted by way of example as part of a housing for a laptop computer 102. As shown, computer 102 includes a base assembly 104 and a display assembly 106 that are pivotally coupled to one another by some suitable means such as, for example, a hinge assembly.

Base assembly 104 includes a housing 108, a keyboard 110, a touchpad 112, and various other well known components (not shown) such as, for example, a frame, motherboard, I/O ports, hard drive, battery, etc. Housing 108 includes a top enclosure 114 and a bottom enclosure 116 that are coupled to one another so as to house keyboard 110, touchpad 112, and the various other components of base assembly 104 that are not shown. Top enclosure 114 includes a bezel or faceplate structure that defines openings that are aligned with keyboard 110 and touchpad 112. Although not shown, bottom enclosure 116 likely includes a removable battery cover that encloses the battery of computer 102 (and other well known laptop computer components).

Display assembly 106 includes a housing 118 and various other well known flip-screen display components (not shown) such as, for example, a liquid crystal display (LCD), frame, speakers, circuit substrates/components, camera module, etc. Housing 118 includes a front enclosure 120 and rear enclosure 100, which are fixably mounted on opposite sides of display assembly 106 so as to, together, house the aforementioned flip-screen display components that are not shown. Front enclosure 120 is a bezel fixably mounted to the front of display assembly 106 so as to cover the peripheral edges the LCD panel. Rear enclosure 100 is fixedly coupled to, for example, the frame and/or some other suitable structure of display assembly 106.

Figure 2:
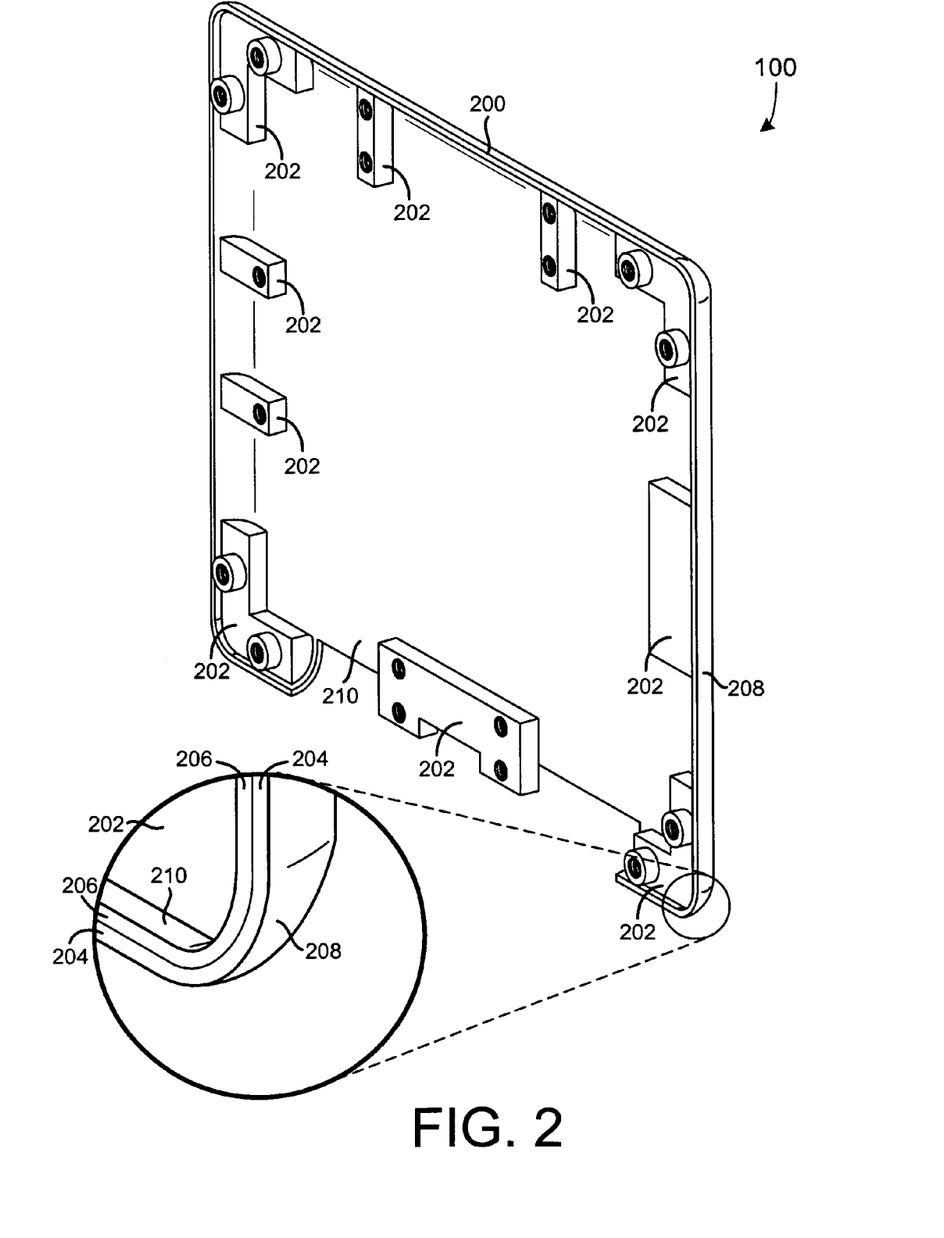
FIG. 2 is a perspective view of the example enclosure shown removed from the laptop computer of FIG. 1.

FIG. 2 is a perspective view of rear enclosure 100 shown removed from the back of display assembly 106 of computer 102. Additionally, FIG. 2 shows an enlarged view of a corner portion of enclosure 100. Enclosure 100 includes a shell 200 and a plurality of three-dimensional mounting structures 202. When enclosure 100 is mounted to display assembly 106, shell 200 covers and protects underlying internal components of display assembly 106 and also contributes to the overall aesthetic appeal of computer 102. Mounting structures 202 are three-dimensional structures (e.g., screw bosses, nut/bolt seats, snap fits, etc.) coupled to shell 200 so as to facilitate the fastening of enclosure 100 to display assembly 106. Structures 202 can also include any other type of structures that can be incorporated into metal shell enclosures such as, for example, scaffolding, stiffeners, ribs, etc.

Shell 200 is a multi-layer composite metal structure that includes a distinct first metal layer 204 and a distinct second metal layer 206 having a direct bond therebetween. In this particular embodiment, shell 200 is constructed from titanium-aluminum clad metal, wherein first metal layer 204 is titanium and second metal layer 206 is aluminum. Accordingly, layers 204 and 206 define an exterior surface 208 and an interior surface 210, respectively, of shell 200. With first metal layer 204 being composed of titanium, or an alloy thereof, exterior surface 208 of shell 200 is substantially more resistant to damage (i.e. surface blemishes, local buckling, etc.) than conventional all-aluminum enclosures.

Although not visible in the view of FIG. 2, exterior surface 208 is decorated using known titanium decorating techniques. For example, exterior surface 208 is colored by anodizing and includes a decorative feature 212 (visible in FIG. 1) formed thereon by titanium laser marking. Those skilled in the art will recognize that specific ornamental design characteristics (e.g., color, size, shape, etc.) of feature 212 will depend on the particular application and are, therefore, not essential aspects of the present invention. Therefore, feature 212 can be any type of laser marked symbol, image, logo, message, decal, pattern, etc.

Mounting structures 202 are three-dimensional molded plastic structures (e.g., screw bosses, snap-fits, shell stiffeners, etc.), which are attached to shell 200 to facilitate the mounting of enclosure 100 to display assembly 106. In this particular embodiment, structures 202 are formed directly on interior surface 210 by Nano-Molding Technology (NMT) such that a direct mechanical bond is achieved therebetween. Alternatively, structures 202 can be formed before being attached to interior surface 210. For example, structures can be molded plastic components fixed to interior surface 210 by an adhesive, double-sided adhesive tape, etc.

Figure 3:
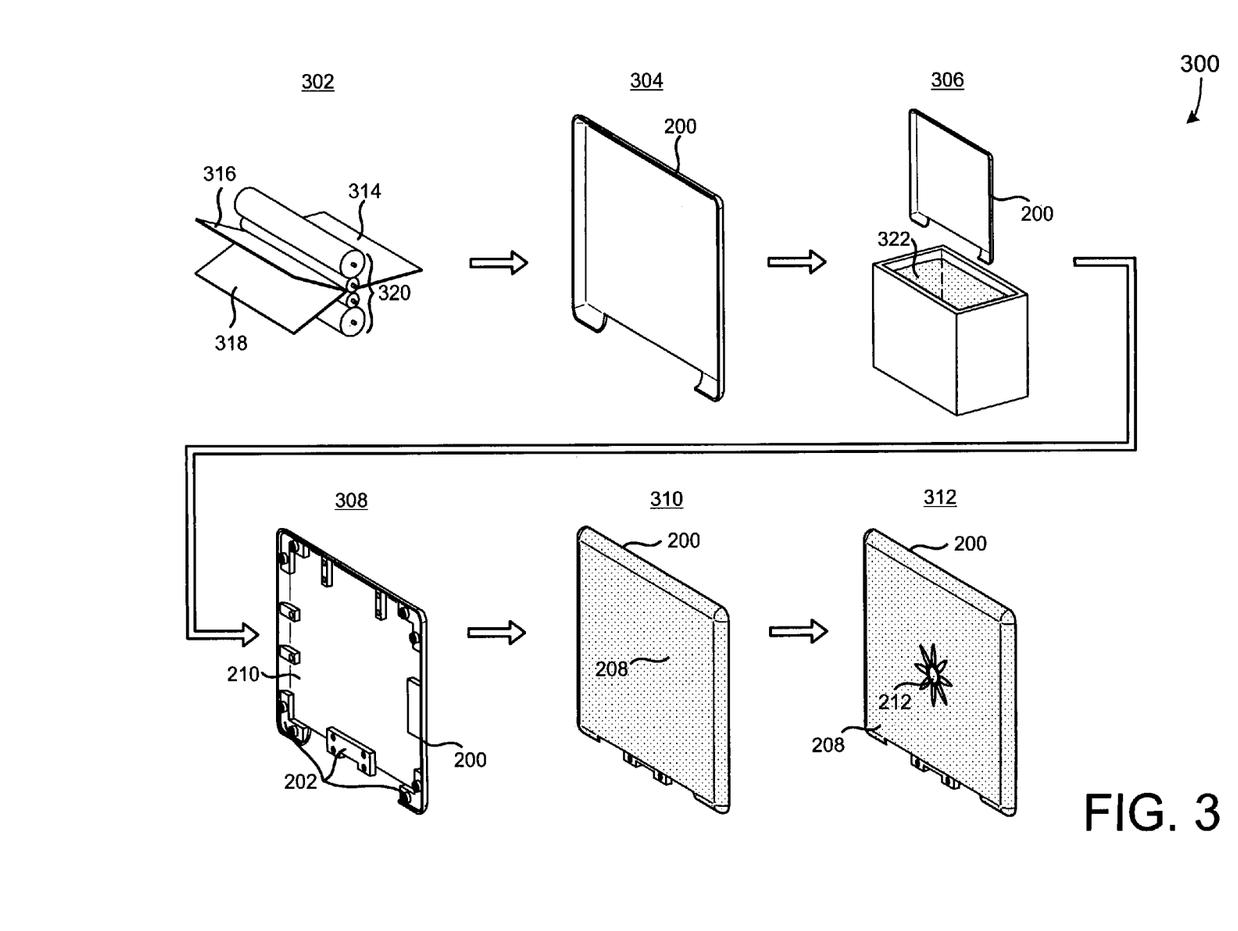
FIG. 3 is a diagram illustrating an example method for manufacturing the enclosure of FIG. 1.

FIG. 3 is a diagram illustrating one example method 300 for manufacturing enclosure 100. Method 300 includes a first stage 302, a second stage 304, a third stage 306, a fourth stage 308, a fifth stage 310, and a sixth stage 312.

Stage 302 includes the formation of cold-rolled titanium/aluminum clad sheet-metal 314 from which shell 200 is constructed. In this particular embodiment, titanium/aluminum clad sheet-metal 314 is formed by simultaneously passing titanium sheet metal 316 and aluminum sheet metal 318 through a roller assembly 320.

Stage 304 includes the formation of shell 200 from the titanium/aluminum clad sheet-metal 314. In this particular embodiment, shell 200 is formed by stamping the titanium/aluminum clad sheet-metal 314.

Third stage 306 includes the preparation of shell 200 for subsequent NMT processes. In this particular embodiment, shell 200 undergoes a T-treatment for creating micro recesses (e.g., pores, gaps, etc.) on interior surface 210. In general, the T-treatment involves one or more processes wherein interior surface 210 is exposed to various etching and/or cleaning chemicals. As shown in this example, shell 200 is submerged in a basic aqueous solution bath 322 that etches aluminum. It should be noted, however, that the etching process of the present invention need not be limited to a T-treatment. Rather, any suitable etching process or series of processes, now known or yet to be discovered, can be used to prepare shell 200 for the NMT process(es).

Fourth stage 308 includes the formation of mounting structures 202. In this particular embodiment, structures 202 are formed directly on and, therefore, coupled directly to interior surface 210 of shell 200 by NMT. In forming structures 202 by NMT, low viscosity thermoplastic (e.g., polyphenylene sulfide plastic, polybutylene terephthalate) melt is injection molded directly on interior surface 210 and then allowed to freeze into the shape of structures 202. During the injection process, the thermoplastic melt seeps into the recesses formed on interior surface 210 during stage 306 such that, upon freezing, portions of structures 202 are permanently anchored and, therefore, mechanically bonded to layer 206.

Fifth stage 310 includes the coloring of exterior surface 208 of shell 200. In this example method, exterior surface 208 is colored by anodizing.

Sixth stage 312 includes the formation of decorative feature 212 on exterior surface 208. In this example method, feature 212 is formed on exterior surface by laser marking.

Figure 4:
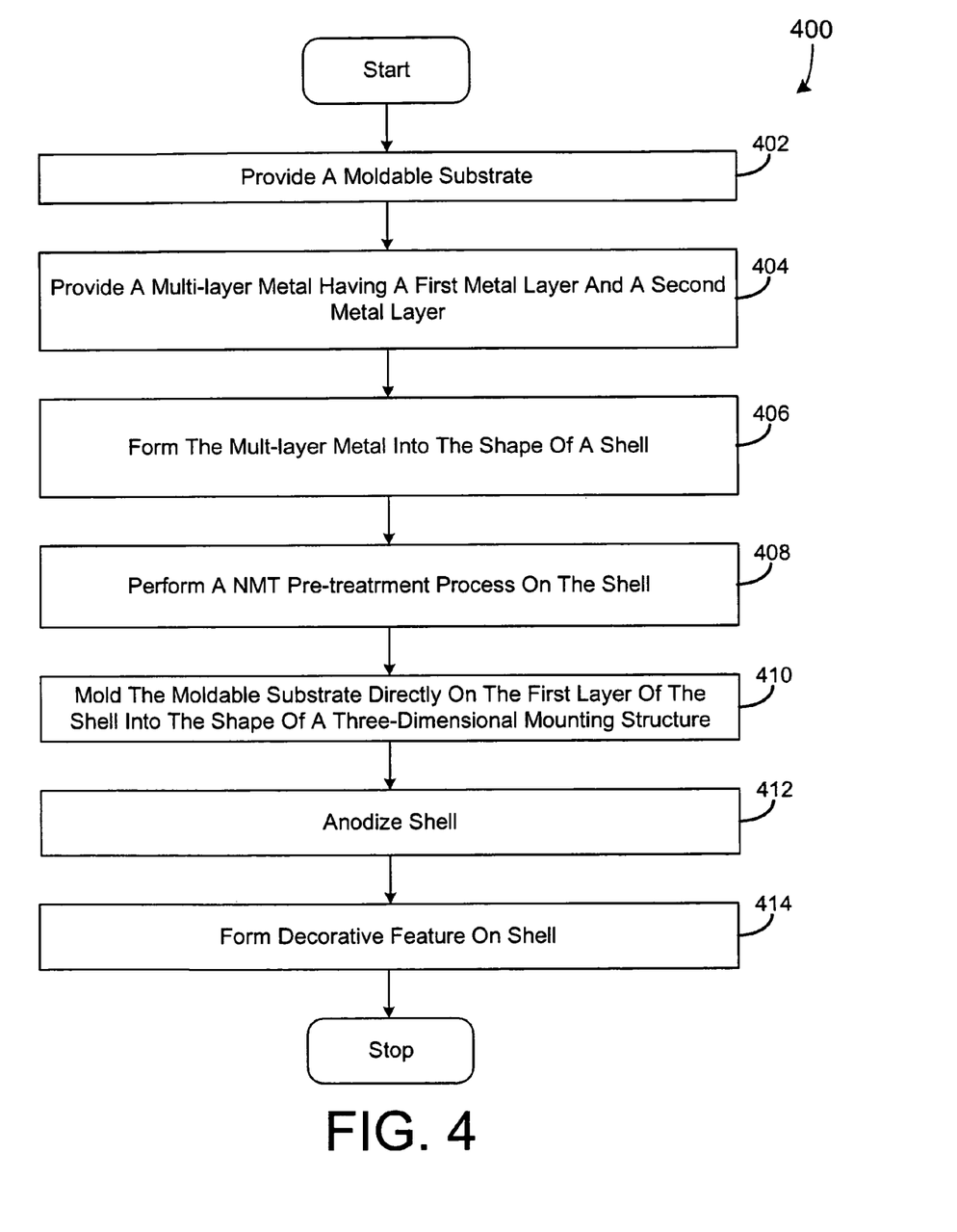
FIG. 4 is flowchart summarizing an example method for manufacturing the enclosure of FIG. 1.

FIG. 4 is a flowchart summarizing an example method 400 for manufacturing an electronic device enclosure. In a first step 402, a moldable substrate is provided. Then, in a second step 404, a multi-layer sheet metal having at least a first metal layer and a second metal layer is provided. Next, in a third step 406, the multi-layer sheet metal is formed into a metal shell. Then, in a fourth step 408, the shell is exposed to an NMT pre-treatment process. Next, in a fifth step 410, the moldable substrate is molded directly on the first layer of the shell into the shape of a three-dimensional mounting structure. Then, in a sixth step 412, the shell is anodized. Finally, in a seventh step 414, a decorative feature is formed on the shell by laser marking.

Figure 5:
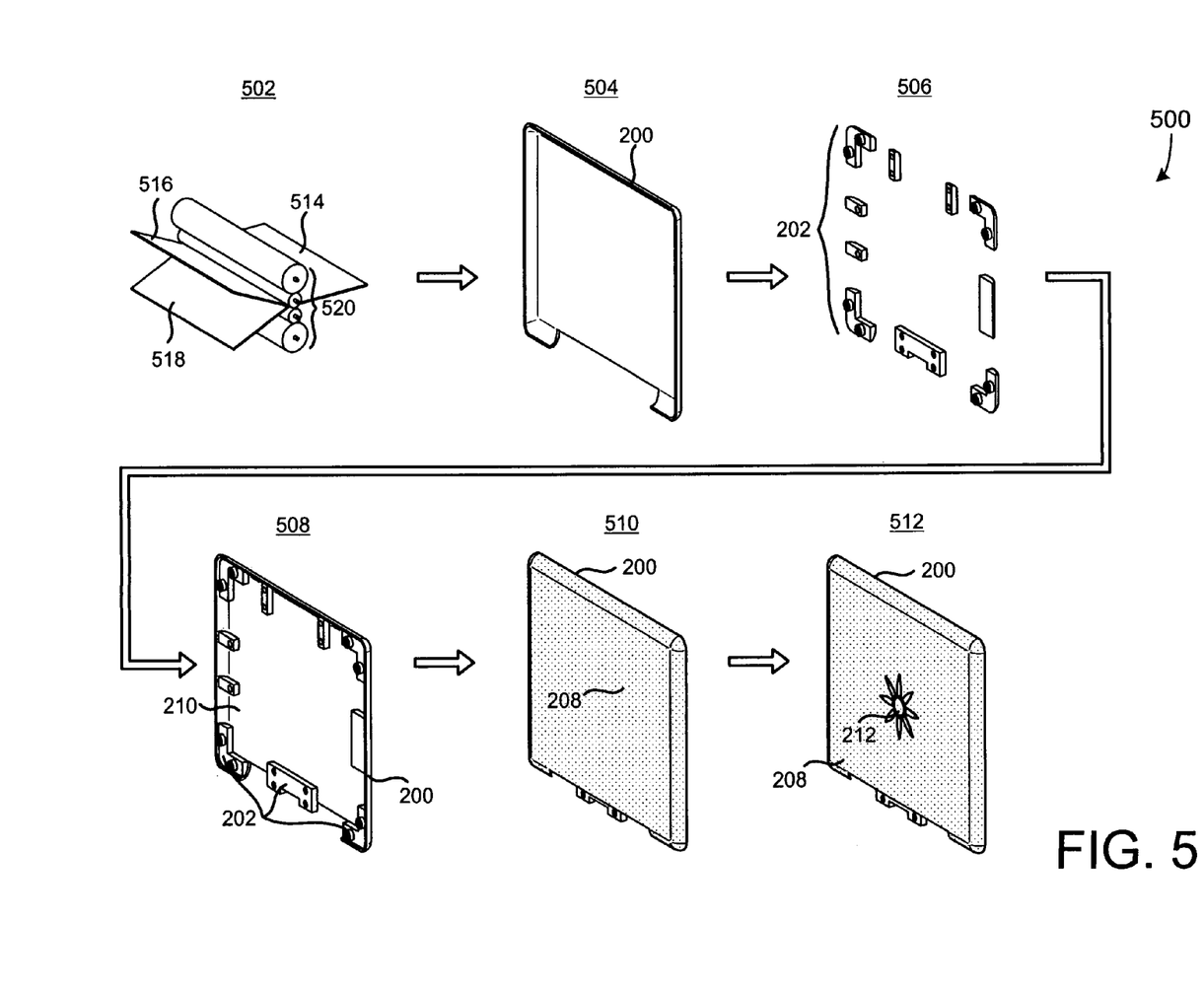
FIG. 5 is a diagram illustrating another example method for manufacturing the enclosure of FIG. 1.

FIG. 5 is a diagram illustrating an alternate method 500 for manufacturing enclosure 100. Method 500 includes a first stage 502, a second stage 504, a third stage 506, a fourth stage 508, a fifth stage 510, and a sixth stage 512.

Stage 502 includes the formation of cold-rolled titanium/aluminum clad sheet-metal 514 from which shell 200 is constructed. In this particular method, titanium/aluminum clad sheet-metal 514 is formed by simultaneously passing titanium sheet metal 516 and aluminum sheet metal 518 through a roller assembly 520.

Stage 504 includes the formation of shell 200 from titanium/aluminum clad sheet-metal 514. In this particular method, shell 200 is formed by stamping titanium/aluminum clad sheet-metal 514.

Stage 506 includes the formation of mounting structures 202. In this particular method, mounting structures 202 are formed before being attached to shell 200. For example, mounting structures are formed by injection molding.

Stage 508 includes the coupling of mounting structures 202 and shell 200. In this particular method, mounting structures 202 are attached directly to interior surface 210 by some suitable means such as, for example, adhesive, epoxy, double-sided sticky tape, etc.

Stage 510 includes the coloring of exterior surface 208 of shell 200. In this particular method, exterior surface 208 is colored by anodizing.

Sixth stage 512 includes the formation of decorative feature 212 on exterior surface 208. In this particular method, feature 212 is formed on exterior surface by laser marking.

Figure 6:
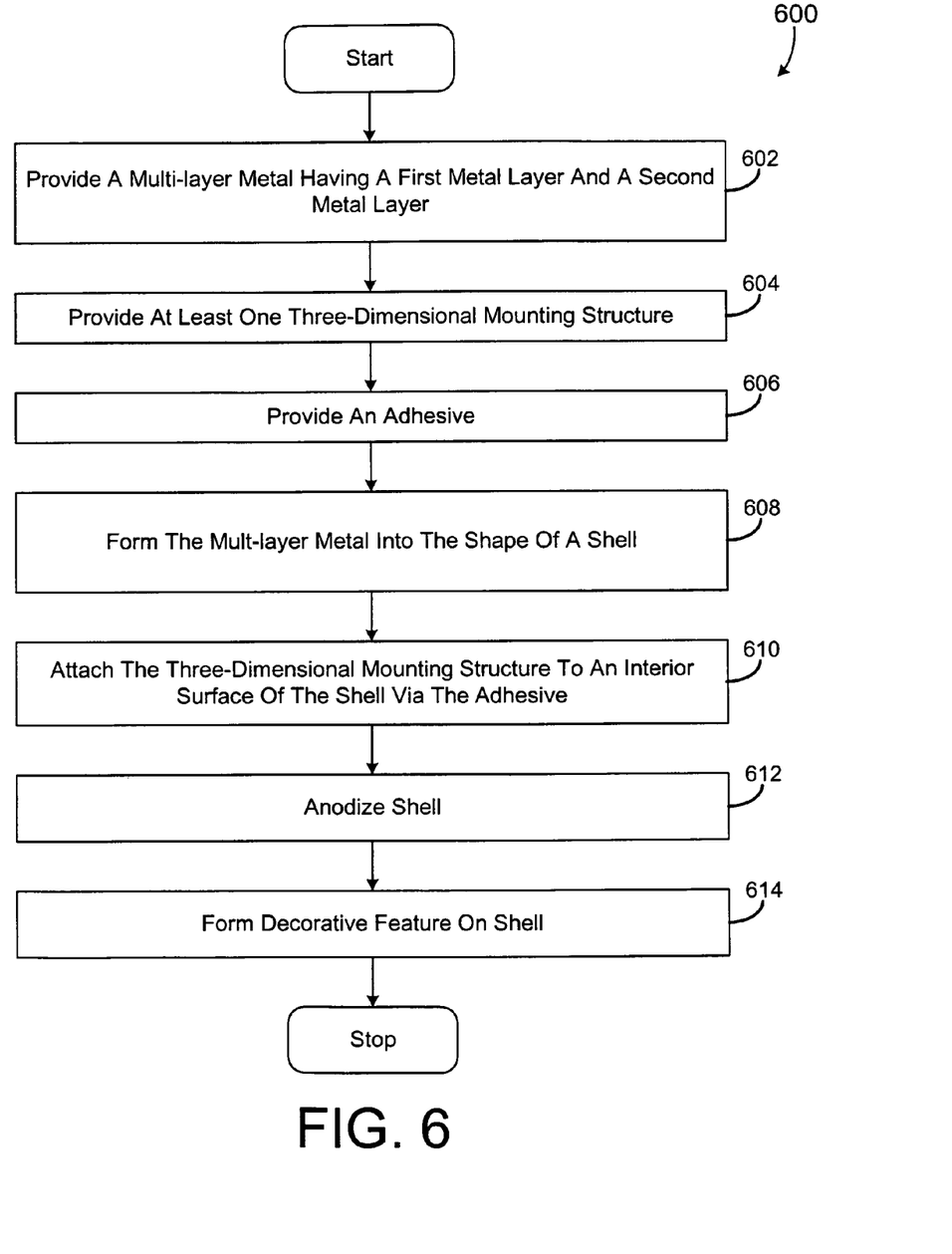
FIG. 6 is flowchart summarizing another example method for manufacturing the enclosure of FIG. 1.

FIG. 6 is a flowchart summarizing an example method 600 for manufacturing an electronic device enclosure. In a first step 602, a multi-layer sheet metal having a first metal layer and a second metal layer is provided. Then, in a second step 604, a three-dimensional mounting structure is provided. Next, in a third step 606, an adhesive is provided. Then, in a fourth step 608, the multi-layer sheet metal is formed into a metal shell. Then, in a fifth step 610, the mounting structures are attached directly to the first layer of the shell by the adhesive. Then, in a sixth step 612, the shell is anodized. Finally, in a seventh step 614, a decorative feature is formed on the shell by, for example, laser marking.

Figure 7:
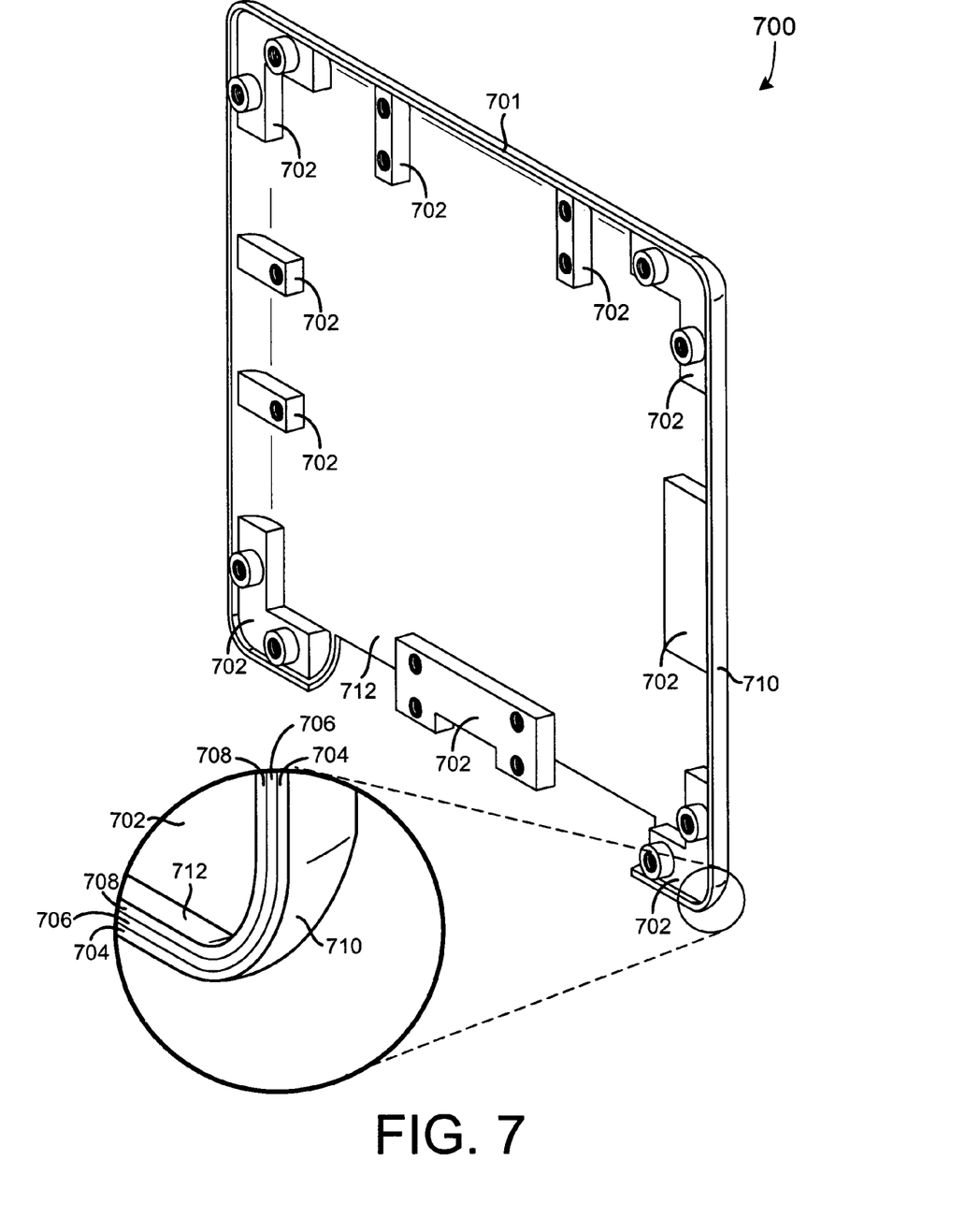
FIG. 7 is a perspective view of an alternate enclosure.

FIG. 7 is a perspective view of an alternate enclosure 700, showing an enlarged view of a corner portion of enclosure 700. Enclosure 700 includes a shell 701 and a plurality of three-dimensional mounting structures 702.

Shell 701 is a multi-layer composite metal structure that includes a distinct first metal layer 704, a distinct second metal layer 706, and a distinct third metal layer 708. In this particular embodiment, shell 701 is constructed from titanium-aluminum clad metal, wherein first metal layer 704 is titanium, second metal layer 706 is aluminum, and third metal layer 708 is titanium. Accordingly, layers 704 and 708 define an exterior surface 710 and an interior surface 712, respectively, of shell 701. With first metal layer 704 being composed of titanium, or an alloy thereof, exterior surface 710 of shell 701 is substantially more resistant to damage (i.e. surface blemishes, local buckling, etc.) than conventional all-aluminum enclosures.

Although not visible, exterior surface 710 is decorated by known titanium decorating techniques. For example, exterior surface 710 is colored by anodizing and includes decorative feature 212 (visible in FIG. 1) formed thereon by titanium laser marking.

Mounting structures 702 are three-dimensional molded plastic structures (e.g., screw bosses, snap-fits, shell stiffeners, etc.), which are attached to shell 701 to facilitate the mounting of enclosure 700 to display assembly 106. In this particular embodiment, structures 702 are formed directly on interior surface 712 by Nano-Molding Technology (NMT) such that a direct mechanical bond is achieved therebetween. Alternatively, structures 702 can be preformed (i.e., formed before being attached to interior surface 712). For example, structures 702 can be molded plastic components fixed to interior surface 712 by an adhesive, epoxy, double-sided adhesive tape, or any other suitable means.

Figure 8:
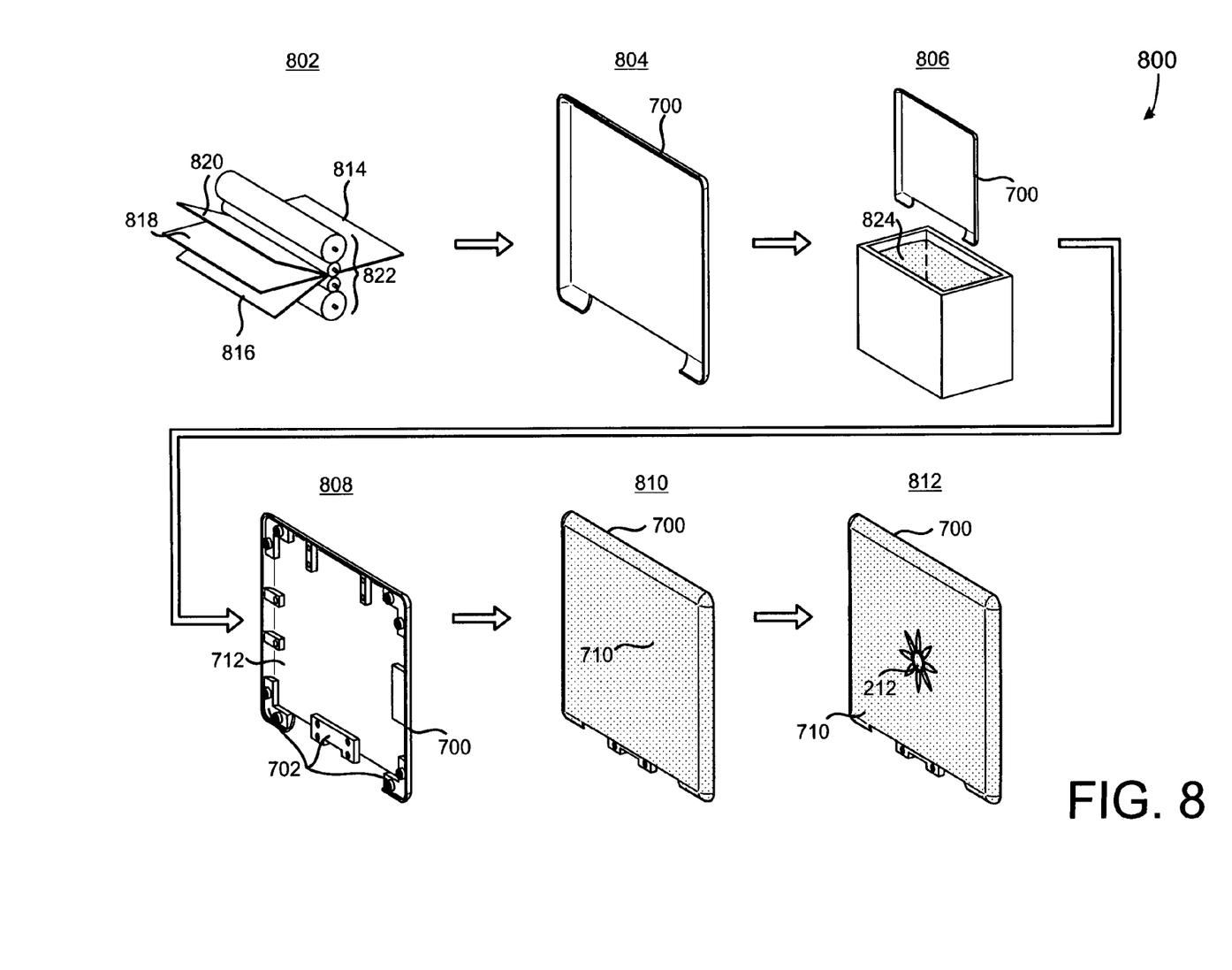
FIG. 8 is a diagram illustrating an example method for manufacturing the enclosure of FIG. 7.

FIG. 8 is a diagram illustrating one example method 800 for manufacturing enclosure 700 according to another embodiment of the present invention. Method 800 includes a first stage 802, a second stage 804, a third stage 806, a fourth stage 808, a fifth stage 810, and a sixth stage 812.

Stage 802 includes the formation of cold-rolled titanium/aluminum clad sheet-metal 814, from which shell 701 is constructed. In this particular method, titanium/aluminum clad sheet-metal 814 is formed by simultaneously passing titanium sheet metal 816, aluminum sheet metal 818, and titanium sheet metal 820 through a roller assembly 822.

Stage 804 includes the formation of shell 701 from titanium/aluminum clad sheet-metal 814. In this particular method, shell 701 is formed by stamping titanium/aluminum clad sheet-metal 814 into the desired shape.

Third stage 806 includes the preparation of shell 701 for subsequent NMT processes. In this particular method, shell 701 undergoes a T-treatment for creating micro recesses (e.g., pores, gaps, etc.) on interior surface 712. In general, the T-treatment involves one or more processes wherein interior surface 712 is exposed to various etching and/or cleaning chemicals. As shown in this example, shell 701 is submerged in a basic aqueous solution bath 824 that etches interior surface 712. It should be noted, however, that the etching process of the present invention need not be limited to a T-treatment. Rather, any suitable etching process or series of processes can be implemented.

Fourth stage 808 includes the formation of mounting structures 702. In this particular method, structures 702 are formed directly on and, therefore, coupled directly to interior surface 712 of shell 701 by NMT. In order to form structures 702 by NMT, low viscosity thermoplastic (e.g., polyphenylene sulfide plastic, polybutylene terephthalate) melt is injection molded directly on interior surface 712 and then allowed to freeze into the shape of structures 702. During the injection process, the thermoplastic melt seeps into the recesses formed on interior surface 712 during stage 806 such that, upon freezing, portions of structures 702 are permanently anchored and, therefore, mechanically bonded to layer 708.

Fifth stage 810 includes the coloring of exterior surface 710 of shell 701. In this particular method, exterior surface 710 is colored by anodizing.

Sixth stage 812 includes the formation of decorative feature 212 on exterior surface 710. In this particular method, feature 212 is formed on exterior surface 710 by laser marking.

Figure 9:
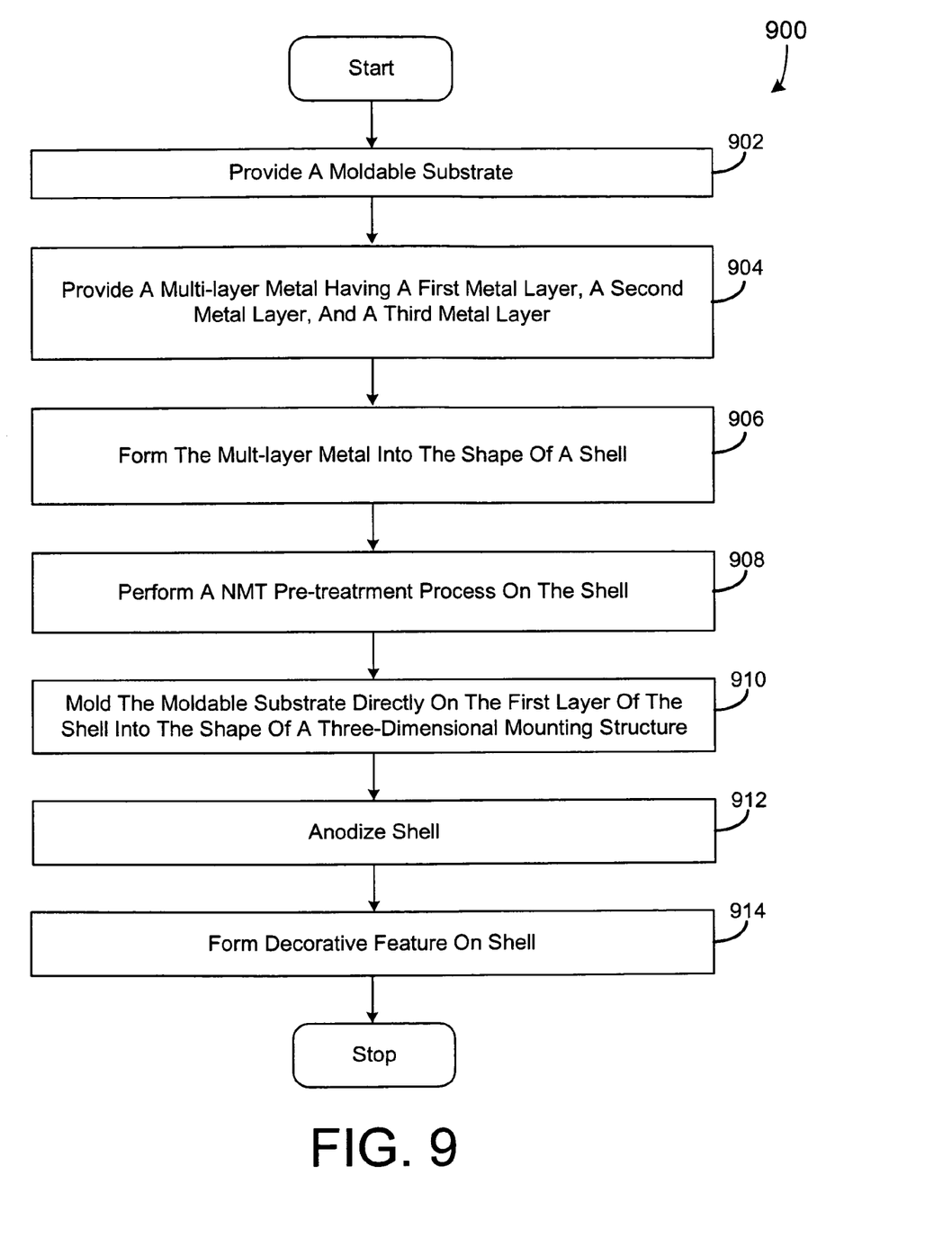
FIG. 9 is flowchart summarizing an example method for manufacturing the enclosure of FIG. 7.

FIG. 9 is a flowchart summarizing another example method 900 for manufacturing an electronic device enclosure. In a first step 902, a moldable substrate is provided. Then, in a second step 904, a multi-layer sheet metal having a first metal layer, a second metal layer, and a third metal layer is provided. Next, in a third step 906, the multi-layer sheet metal is formed into a metal shell. Then, in a fourth step 908, the shell is exposed to an NMT pre-treatment process. Next, in a fifth step 910, the moldable substrate is molded directly on the first layer of the shell into the shape of a three-dimensional mounting and/or support structure. Then, in a sixth step 912, the shell is anodized. Finally, in a seventh step 914, a decorative feature is formed on the shell by laser marking.

Figure 10:
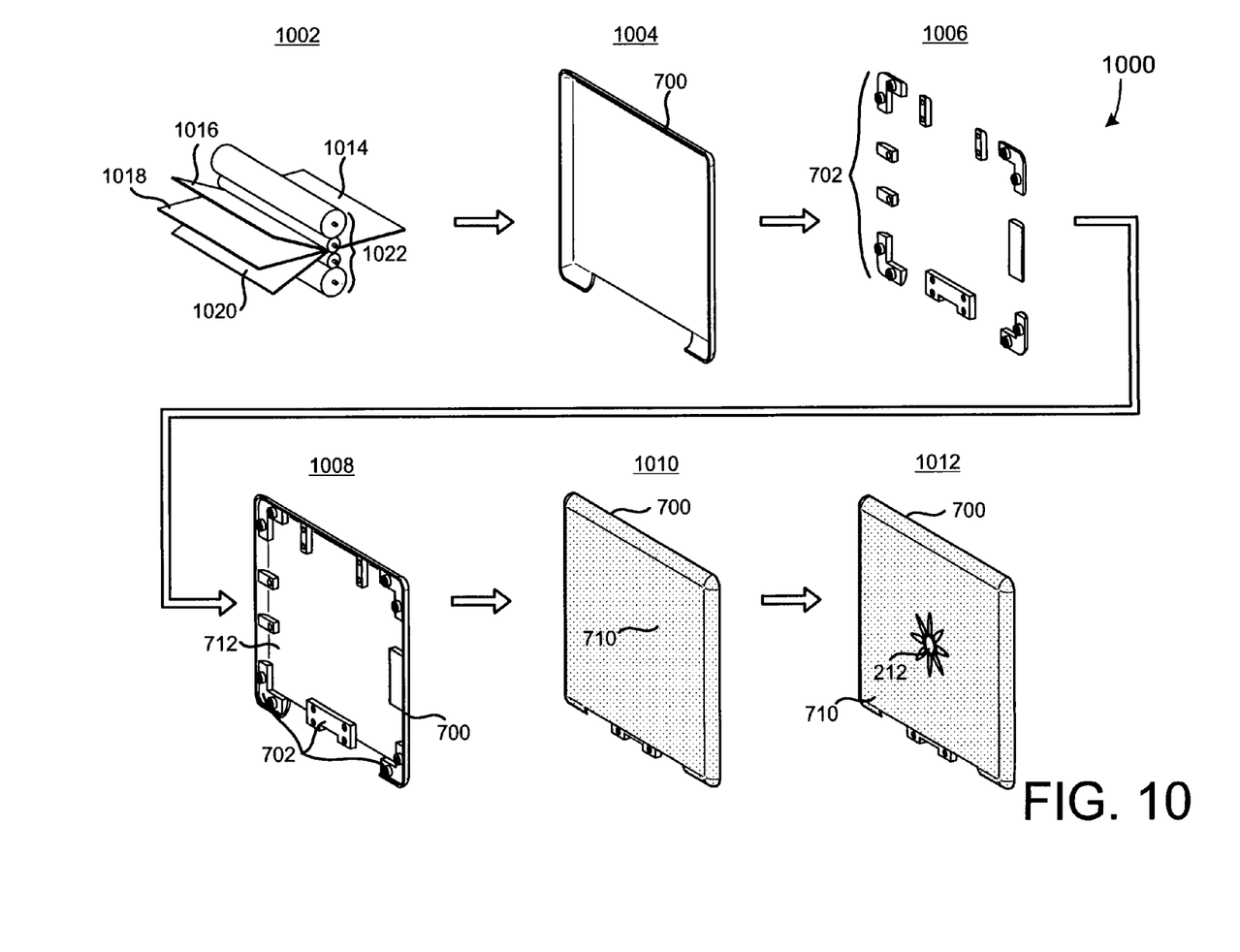
FIG. 10 is a diagram illustrating another example method for manufacturing the enclosure of FIG. 7.

FIG. 10 is a diagram illustrating another example method 1000 for manufacturing enclosure 700. Method 1000 includes a first stage 1002, a second stage 1004, a third stage 1006, a fourth stage 1008, a fifth stage 1010, and a sixth stage 1012.

Stage 1002 includes the formation of cold-rolled titanium/aluminum clad sheet-metal 1014, from which shell 701 is constructed. In this particular method, titanium/aluminum clad sheet-metal 1014 is formed by simultaneously passing titanium sheet metal 1016, aluminum sheet metal 1018, and titanium sheet metal 1020 through a roller assembly 1022.

Stage 1004 includes the formation of shell 701 from titanium/aluminum clad sheet-metal 1014. In this particular method, shell 701 is formed by stamping titanium/aluminum clad sheet-metal 1014 into the desired shape.

Stage 1006 includes the formation of mounting structures 702. In this particular method, mounting structures 702 are formed before being attached to shell 701. For example, mounting structures can be formed by injection molding.

Stage 1008 includes the fixation of mounting structures 702 to shell 701. In this particular method, mounting structures 702 are attached directly to interior surface 712 by, for example, adhesive, epoxy, double-sided sticky tape, or any other suitable fixation means.

Stage 1010 includes the coloring of exterior surface 710 of shell 701. In this particular method, exterior surface 710 is colored by anodizing.

Sixth stage 1012 includes the formation of decorative feature 212 on exterior surface 710. In this particular method, feature 212 is formed on exterior surface 710 by laser marking.

Figure 11:
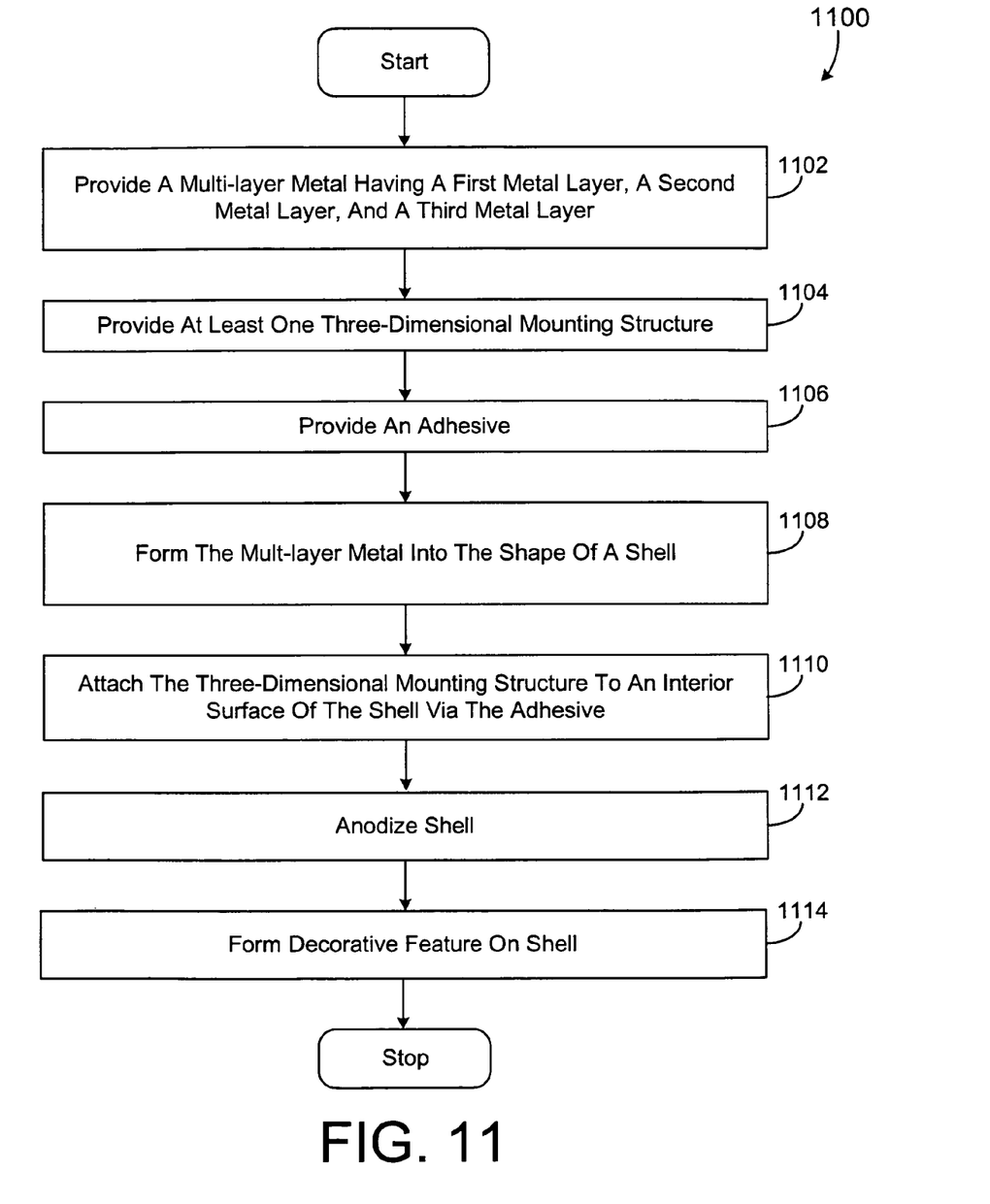
FIG. 11 is flowchart summarizing another example method for manufacturing the enclosure of FIG. 7.

FIG. 11 is a flow diagram summarizing another example method 1100 for manufacturing an electronic device enclosure. In a first step 1102, a multi-layer sheet metal having a first metal layer, a second metal layer, and a third metal layer is provided. Then, in a second step 1104, a three-dimensional mounting structure is provided. Next, in a third step 1106, an adhesive is provided. Then, in a fourth step 1108, the multi-layer sheet metal is formed into a metal shell. Then, in a fifth step 1110, the mounting structures are attached directly to the first layer of the shell by the adhesive. Then, in a sixth step 1112, the shell is anodized. Finally, in a seventh step 1114, a decorative feature is formed on the shell by, for example, laser marking.

The description of particular embodiments of the present invention is now complete. Many of the described features may be substituted, altered or omitted without departing from the scope of the invention. For example, alternate host devices (e.g., cell phones, PDAs, cameras, etc.), may be substituted for the laptop computer 102. As another example, alternate types of clad sheet metal can substituted for the example clad sheet metals described herein. These and other deviations from the particular embodiments shown will be apparent to those skilled in the art, particularly in view of the foregoing disclosure.

We claim:

1. An electronic device enclosure, comprising:
   a clad metal shell having;
   a first substantially uniform layer being a first type of metal, said first layer defining a first surface of said shell,
   a second substantially uniform layer being a second type of metal, said second type of metal being different from said first type of metal, and
   a third substantially uniform layer being a third type of metal, said third type of metal being titanium; and
   a mounting structure attached to said first surface of said clad metal shell, wherein said mounting structure is formed directly on said first surface of said clad metal shell by nano molding technology;
   wherein said first, second, and third layers are substantially coextensive.

2. An electronic device enclosure according to claim 1, wherein said clad metal shell is stamped from clad sheet metal.

3. An electronic device enclosure according to claim 1, further comprising a decorative feature formed on said clad metal shell by laser marking.

4. An electronic device enclosure according to claim 1, wherein at least a portion of said clad metal shell is anodized.

5. An electronic device enclosure according to claim 1, said clad metal shell comprising bimetallic clad metal.

6. An electronic device enclosure according to claim 5, wherein said first type of metal is aluminum and said second type of metal is titanium.

7. An electronic device enclosure according to claim 5, wherein said first type of metal is aluminum and said second type of metal is stainless steel.

8. An electronic device enclosure according to claim 5, wherein said bimetallic metal is cold-rolled bimetallic sheet metal.

9. An electronic device enclosure according to claim 1, said first metal layer being titanium.

* * * * *